US009985185B2

(12) United States Patent
Kubat et al.

(10) Patent No.: US 9,985,185 B2
(45) Date of Patent: May 29, 2018

(54) WHITE LIGHT EMITTING DIODE WITH SINGLE CRYSTAL PHOSPHOR AND THE MANNER OF PRODUCTION

(71) Applicant: Crytur, spol. s.r.o., Turnov (CZ)

(72) Inventors: Jan Kubat, Zdar u Mnichova Hradiste (CZ); Jindrich Houzvicka, Turnov (CZ); Jan Polak, Turnov (CZ)

(73) Assignee: CRYTUR, SPOL. S.R.O., Turnov (CZ)

( * ) Notice: Subject to any disclaimer, the term of this patent is extended or adjusted under 35 U.S.C. 154(b) by 82 days.

(21) Appl. No.: 14/779,666

(22) PCT Filed: Apr. 22, 2014

(86) PCT No.: PCT/CZ2014/000039
§ 371 (c)(1),
(2) Date: Sep. 24, 2015

(87) PCT Pub. No.: WO2014/173376
PCT Pub. Date: Oct. 30, 2014

(65) Prior Publication Data
US 2016/0056347 A1    Feb. 25, 2016

(30) Foreign Application Priority Data

Apr. 22, 2013   (CZ) .................................... 2013-301

(51) Int. Cl.
*C09K 11/77*      (2006.01)
*H01L 33/50*      (2010.01)
(Continued)

(52) U.S. Cl.
CPC ........ *H01L 33/502* (2013.01); *C09K 11/7774* (2013.01); *C30B 29/28* (2013.01);
(Continued)

(58) Field of Classification Search
CPC ... H01L 33/502; H01L 33/504; H01L 33/505; H01L 33/507; H01L 33/0075; H01L 33/32
See application file for complete search history.

(56) References Cited

U.S. PATENT DOCUMENTS 6,600,175 B1    7/2003   Baretz et al.
7,285,791 B2 *  10/2007  Beeson ................. H05B 33/10
                                                        250/483.1
(Continued)

FOREIGN PATENT DOCUMENTS

CN    102769080 A    11/2012
EP    0 476 952 A2    3/1992
(Continued)

*Primary Examiner* — C Melissa Koslow
(74) *Attorney, Agent, or Firm* — Jacobson Holman, PLLC.

(57) ABSTRACT

According to the invention, the diode with a single crystal phosphor placed over the chip selected from the InGaN, GaN or AlGaN group comprises the fact that the single crystal phosphor (21) is created from the monocrystalline ingot (51), created by LuYAG or YAP hosts, doped with the atoms selected from the $Ce^{3+}$, $Ti^{3+}$, $Eu^{2+}$, C, $Gd^{3+}$ or $Ga^{3+}$ group, grown from the melt with the method selected from the Czochralski, HEM, Badgasarov, Kyropoulos or EFG group, when the $Lu^{3+}$, $Y^{3+}$ and $Al^{3+}$ atoms can be replaced in the host up to the amount of 99.9% with the $B^{3+}$, $Gd^{3+}$ or $Ga^{3+}$ atoms.

5 Claims, 8 Drawing Sheets

(51) Int. Cl.
  *C30B 29/28* (2006.01)
  *H05B 33/14* (2006.01)
  *H01L 27/15* (2006.01)
  *H01L 33/00* (2010.01)
  *H01L 33/32* (2010.01)
  *H01L 33/44* (2010.01)

(52) U.S. Cl.
  CPC ........ *H01L 27/156* (2013.01); *H01L 33/0075* (2013.01); *H01L 33/32* (2013.01); *H01L 33/44* (2013.01); *H01L 33/505* (2013.01); *H01L 33/507* (2013.01); *H05B 33/14* (2013.01); *Y02B 20/181* (2013.01)

(56) References Cited

U.S. PATENT DOCUMENTS

| | | | |
|---|---|---|---|
| 8,133,461 B2 | 3/2012 | Tao et al. | |
| 9,112,123 B2 * | 8/2015 | Aoki | H01L 33/502 |
| 2006/0000408 A1 | 1/2006 | Kurashige et al. | |
| 2008/0283864 A1 | 11/2008 | LeToquin et al. | |

FOREIGN PATENT DOCUMENTS

| | | |
|---|---|---|
| EP | 0 936 682 A1 | 8/1999 |
| EP | 2 202 444 A1 | 6/2010 |
| JP | 2000-263499 A | 9/2000 |
| WO | 2007/005013 A1 | 1/2007 |
| WO | 2009/126272 A1 | 10/2009 |
| WO | 2010/143086 A1 | 12/2010 |
| WO | WO 2012/057330 * | 3/2012 |
| WO | 2012/110009 A1 | 8/2012 |
| WO | 2013/161683 A1 | 10/2013 |

* cited by examiner

WHITE LIGHT EMITTING DIODE WITH SINGLE CRYSTAL PHOSPHOR AND THE MANNER OF PRODUCTION

BACKGROUND OF THE INVENTION

The invention refers to efficient white light emitting diodes with the power above 0.5 W and luminous flux above 40 lm when utilizing the phosphor technology to convert light. Furthermore, the invention involves the optimizing of the single crystal phosphor, its composition and shape and diode construction arrangement.

DESCRIPTION OF PRIOR ART

The structure of the standard white light emitting diodes (also only as "W-LED") does not allow to emit the while light directly but is based on composing the blue (450 to 470 nm maximally) and the yellow (550 nm maximally), or, possibly, the red component of the colour spectrum (EP0936682 and U.S. Pat. No. 6,600,175 patents). In the most common arrangement, it is the structure with an InGaN chip with quantum holes, emitting blue light with emission peak between 455 to 470 nm, when quantum efficiency of the chip decreases towards the longer wavelengths and with the increasing portion of InN in the chip. The yellow component is obtained with a partial downconversion of the blue light emitted by the chip with the aid of fluorescent material that is called "phosphor". Regarding its outstanding properties, what is used in most applications as the phosphor is $(Y_{1-a}Gd_a)_3(Al_{1-b}Ga_b)_5O_{12}:Ce^{3+}$, where $0<a<1$, $0<b<1$,—yttrium-aluminium garnet doped with cerium, or possibly with gallium or gadolinium (further on only as YAG:Ce). Blue light photons absorbed in this material are converted with up to 100% efficiency due to the Stokes shift into photons with lower energy and emission peak at 55 nm (EP0936682 patent). The amount of converted blue photons is directly proportionate to the $Ce^{3+}$ atoms concentration in the material.

All these phosphors are applied over the diode in the forms of a layer of powder or poly-crystalline ceramics with the grain size of hundreds of nanometers up to tens of micrometers (US/8133461, WO/2008/051486A1). The phosphor can be placed either in a thin layer directly over the InGaN chip or can be dispersed in the epoxy or silicone optics over the chip. Of utmost importance is the even distribution of the phosphor in dependence on the light angle of the blue light from the chip to preserve the colour homogeneity of the resulting light.

When deposing the light converting phosphor it is vital to keep the homogeneous distribution of the phosphor so that the colour temperature of light should not be dependent on the angle of the light. In all stated cases, however, the commonly used powder phosphor suffers from a range of shortcomings, such as backscattering, temperature extinction and thermal degradation.

The phenomenon of backscattering of the light on the phosphor grains of the size exceeding 500 nm causes a significant decrease in the light intensity in the desired direction. The Rayleigh scattering of light on the phosphor grains with smaller size than the light wavelength results in the deflection of the photons in various directions and back too in the undesirable direction towards the chip. If the number of these scattering centres is large, the intensity of the backscattered light is not negligible and may be in tens of percent of the total intensity. Subsequently, the backscattered light is absorbed in the individual parts of the diode and contributes to its further warming-up. This phenomenon can be reduced by decreasing the grains size to the size which is lower than the light wavelength which makes them invisible for the individual photons and the light can penetrate through them more easily. However, the decreasing size of the powders results in the drop in the conversion efficiency of the phosphor due to the increasing influence of defects on the surface of the individual grains.

A significant problem of the standard diodes is the warming-up of the chip and phosphor in the course of operation. The heat is generated by the InGaN chip itself, whose efficiency is approximately 30%, and it originates too in the phosphor during the conversion of light towards longer wavelengths during the Stokes shift. The phosphor can be locally exposed to the temperature of up to 200° C., which results in the decrease in the luminescent efficiency of the phosphor (the ratio of the absorbed blue and emitted yellow photons), this is called temperature extinction of the phosphor. The extinction shows the most with the phosphor of the smallest-size grains. The internal part of the grains is monocrystalline, however, on their surface there is a large number of defects and related surface faults of the lattice structure resulting both from the working and from the natural character of the material. These defects function as no-light emission recombination centres which significantly decrease the conversion efficiency of the phosphor. Phosphor extinction shows with the concentration exceeding 0.5 at % $Ce^{3+}$ in the YAG host. Larger concentrations of $Ce^{3+}$ are used at the same time to decrease the volume of the powder phosphor and to reduce the backscattering effect.

Equally, the increased temperature significantly increases the thermal degradation of the individual parts of the diode. Silicone polymers, the most commonly used encapsulant and lens materials of efficient W-LEDs, are relatively stable. Despite of this, the thermal influence causes the encapsulant material decomposition and the creation of optically active defects on the border of the microcrystalline grain of the phosphor and encapsulant. These defects contribute to the decrease of the total radiated power and further diode warming-up.

One manner of solving the problems related to heat generation is something that is called "remote phosphor" (WO/2010/143086A1; EP2202444; WO/2009/134433A3), when the converting material of the phosphor powder is dispersed onto a larger surface and located outside the direct contact with the InGaN chip. For example, it is deposited in a thin layer onto the optically permeable plate located in the blue light beam emitted by the chip or located onto the internal wall of the external lamp sheath so that at least some portion of the blue light is converted towards the longer wavelengths.

The solution to the major drawbacks of powder and polycrystalline ceramic materials is the use of transparent single crystal phosphor. The monocrystalline layer also significantly decreases the scattering of light in comparison with the polycrystalline phosphor and eliminates the effect of undesirable backscattering. The patents (WO2009/126272) of the CREE company depict the use of monocrystalline layers of the $Y_3Al_5O_{12}:Ce^{3+}$, $Tb_{3-x}RE_xO_{12}:Ce^{3+}$ or $Sr_{2-x-y}Ba_xCa_ySiO_4:Eu$ phosphors, prepared by epitaxial methods or by the method of extracting the rotating crystal from the melt, both directly on the InGaN chip and on the substrate from which it is subsequently transferred above the InGaN chip. In case of the (WO2009/126272) patent the single crystal phosphor is always rigidly connected with the chip so that better outcoupling of the generated light from the chip is achieved, with the refractive index exceeding 2.4.

In case of light transition directly into the single crystal phosphor with the refractive index minimally 1.7 it is possible to obtain more light from the chip than with the commonly used encapsulant which has refractive index between 1.4 and 1.6.

The thickness of the epitaxial layer, prepared by the Liquid Phase Epitaxy (LPE) methods, is however limited by several tens of micrometers and to obtain sufficient light absorption from the chip, the layer must by strongly doped with $Ce^{3+}$. Due to the cerium atom size, the high doping agent concentrations result in the increased number of defects which decrease the luminescent efficiency of the resulting layer. The (WO2009/126272) patent describes too the possibility of doping the phosphor with several various doping agents in some regions over the InGaN chip itself so that the better colour rendition of the resulting white diode is achieved due to the broader colour spectrum emission.

The patent (WO 2009/126272) specifies the utilization of circular monocrystalline plates of the 0.5 to 1 mm thickness and of the 6 mm diameter as the phosphor. The phosphor surface can be cut, textured or planarised. According to the patent (WO 2009/126272), to achieve the spatially more homogeneous colour rendition, foreign particles are added in the phosphor itself or to the encapsulating material, functioning as scattering centres, however, the type of the useable material is not specified in any single example. The single crystal phosphor always at least partially covers the chip and a portion of light is converted through it.

Furthermore, this patent (WO 2009/126272) mentions the use of a single crystal on the basis of YAG:$Ce^{3+}$ as a self-supporting substrate for the preparation of semi-conductor structures on the basis of InGaN which could result in the decrease in the total internal reflection in the semi-conductor chip itself with the refractive index of 2.5, which is, however, not feasible in practice due to the different lattice constant of both the materials. The difference in lattice constant of both the materials, that is 12.01Å for single crystal YAG and 5.185Å for GaN up to 5.69 Å for InN, will lead to a massive creation of internal defects and dislocations in the InGaN chip and to a significant deterioration of operational properties and stability.

The patent attempts to solve the application of light-converting structures on the basis of the single crystal phosphor which shows better properties than its powder variants and deals with the arrangement of chip fitting with the phosphor.

In the stated patent (US2008/0283864), the single crystal phosphor from the materials on the basis of $Y_3Al_5O_{12}$, $Ca_xSr_yMg_{1-x-y}AlSiN_3$, $Sr_{2-x}Ba_xSiO_4SiAlON$, $Y_2O_2S$ or $La_2O_2S$, produced from melt by the Czochralski or Bridgeman methods, is used in the form of light-converting structures with planar surfaces which is fixed onto the chip with a silicone adhesive layer. According to this patent, the single crystal phosphor with the thickness of 10 nm to 200 µm achieves cerium doping in the range of 0.1 up to 20% or 0.5 up to 20% of europium.

Thus it proposes to adjust the phosphor shape and size so that the chip could be spatially fitted with the phosphor, the phosphor surface can be textured, roughened or shaped differently to decrease the total reflexion phenomenon. The single crystal phosphor can too be complemented with one more optical element for the better outcoupling of light from the chip.

According to this patent too, the polished single crystal phosphor can be utilized as the substrate for the semi-conductor chip production. It includes too the preparation of the single crystal phosphor layer on the semi-conductor chip itself with the method of thin layers preparation and the opposite procedure where the semi-conductor chip is prepared by growing with classical methods on a polished layer of the single crystal phosphor. Nevertheless, in both the stated cases the problem is the different value of the material lattice constant, leading during the growing process to the creation of internal defects, such as dislocations.

SUMMARY OF THE INVENTION

According to the invention, the white light emitting diode with single crystal phosphor placed over the chip selected from the InGaN, GaN or AlGaN group comprises the fact that the single crystal phosphor is created on the basis of the hosts with the chemical composition LuYAG/$(Lu,Y)_3Al_5O_{12}$/, or YAP/$YAlO_3$/, doped with atoms selected from the $Ce^{3+}$, $Ti^{3+}$, $Eu^{2+}$, C, $Gd^{3+}$ or $Ga^{3+}$ group. And at the same time single crystal phosphor contains induced colour centres on oxygen vacancies with emission peaks at 410 nm and 615 nm.

The single crystal phosphor contains hosts on the basis of $(Lu_x, Y_{1-x})_3Al_5O_{12}$, where X is 0.01 to 0.99, or $YAlO_3$, doped with $Ce^{3+}$, $Ti^{3+}$, $Eu^{2+}$, wherein the $Lu^{3+}$, $Y^{3+}$ and $Al^{3+}$ atoms are replaced in the hosts with the $Gd^{3+}$ or $Ga^{3+}$ atoms in the amount of 0.01 to 99.9 wt %.

The concentration of $Ce^{3+}$ in the single crystal phosphor ranges between 0.02 to 0.5 wt % and/or the concentration of $Eu^{2+}$ ranges between 0.001 to 1 wt % and/or the concentration of $Ti^{3+}$ ranges between 0.05 to wt 5%.

The single crystal phosphor is preferably provided with at least one more layer of the complementary phosphor on the aluminate basis from the $(Lu,Y)_3Al_5O_{12}$, $Y_3Al_5O_{12}$, $YAlO_3$ or $Al_2O_3$ group, doped with rare earths.

The single crystal phosphor is preferably created with at least one layer of the complementary phosphor composed of $(Lu,Y)_3Al_5O_{12}$:$Ce^{3+}$ with the $Ce^{3+}$ concentration from 0.01 to 0.5 wt % and with at least one more layer of the complementary phosphor composed of $YAlO_3$:$Ti^{3+}$ with $Ti^{3+}$ concentration from 0.1 to 5 wt %.

The outmost phosphor surface, averted from the chip, ensures the extraction of converted light in the direction from the diode InGaN chip itself towards the object that is being illuminated and, therefore, there are attempts to limit the total reflection effect on the interface of the single crystal phosphor and encapsulant or the single crystal phosphor or the external environment. The following manner of phosphor treatment and the final white light emitting diode structure contribute to the limitation.

The single crystal phosphor is preferably separated physically from the chip and there is a light conducting silicon layer with the refractive index of minimally 1.5 between the chip and the single crystal phosphor and the single crystal phosphor could be physically connected with the cooler to optimize the withdrawal of the generated heat away from the phosphor itself.

The diode preferably contains at least one chip and at least one single crystal phosphor and the chips and single crystal phosphor are the same or different. The diode can also contain at least 2 chips and one single crystal phosphor. The diode can contain at least 2 chips, when at least one chip is fitted with the single crystal phosphor according to the invention and at least one chip emits light with the peak between 600 to 700 nm.

Figure 1:
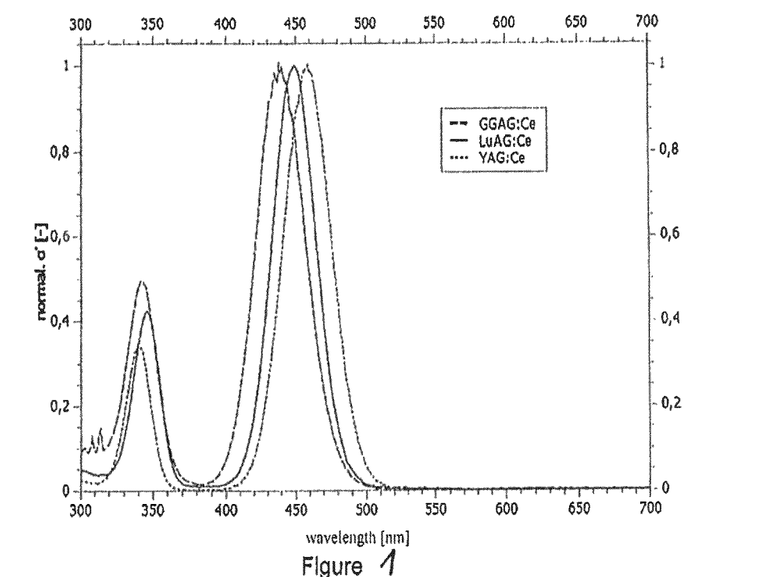
FIG. 1 Normalized YAG:Ce, LuAG:Ce materials absorption spectra

The single crystal phosphor on the basis of $(Lu,Y)_3Al_5O_{12}$:Ce (LuYAG:Ce) has the main absorption peak shifted up to 445 nm, in comparison with the YAG:Ce material where it is at 460 nm, in dependence on the Y and Lu atoms ratio, and is better suited for the InGaN chips emitting in this area, see FIG. 1. It also enables to change the emitting maximum of the phosphor in the area from 535 to 555 nm, depending on the Lu and Y atoms ratio, so that the CRI value is maximized. In doing so, the conversion efficiency of the phosphor does not change at all.

In comparison with the YAG:Ce material, patented in the current patents, the utilization of the phosphor on the basis of LuYAG:Ce, emitting green light, results in better coverage of the whole visible spectrum and when combining with another phosphor for red light or with another red light source in the area above 600 it results in the colour rendition index values exceeding 95. The material also shows high thermal luminescence stability and resistance against temperature extinction, up to the 700 K temperatures.

The single crystal phosphor on the $YAlO_3$ (YAP) host basis enables to obtain completely new phosphor kinds which cannot be efficiently produced in the powder form since the perovskite phase is less preferable compared to the garnet phase and the preparation of the pure perovskite phase in the powder form is virtually impossible. However, when preparing the material from melt, the conditions for growth can be established in such a manner that the resulting single crystal is composed of the perovskite phase only. YAP based phosphors deliver efficiencies comparable with YAG based fluorescent materials when the shifted lattice parameters of YAP compared to YAG shift the absorption and emission of most dopants for even several hundred nm, for example YAP:Ce emits light with the 370 nm peak compared to YAG:Ce with the 555 nm peak. The YAP:Ti material emits in the orange colour spectrum area with the emission peak near 580 nm and absorption in the area of 410 to 500 nm.

The significantly smaller ratio between the phosphor volume and surface in comparison with the single crystal phosphors powder versions also contributes to the significantly higher resistance of the phosphor and encapsulant interface.

Limiting the total reflection influence and increasing the extraction intensity in the desirable direction can be accomplished in several manners. One of the options is the treatment of the single crystal phosphor surface averted from the chip in such a way that it contains surface unevennesses of the size corresponding minimally to the extracted light wavelength. The defects of a significantly smaller size than the yellow light wavelength remain almost invisible for this light due to the influence of the light wave character, there occurs only the Rayleigh scattering.

Figure 2:
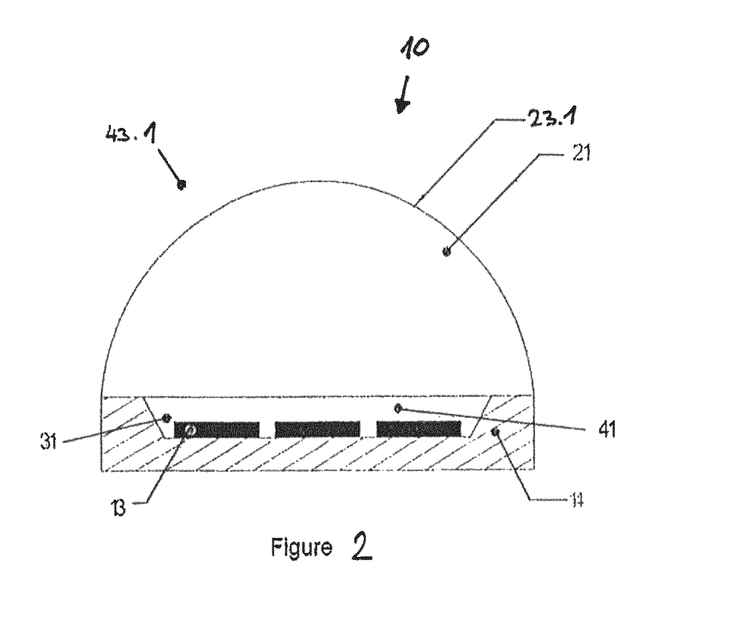
FIG. 2 Light emitting diode with a single crystal phosphor

Another option is to induce scattering centres in the material in the form of defined monocrystalline material absence, changing randomly the direction of penetrating beams, which significantly decreases the amount of total reflections inside the single crystal phosphor. The scattering centres can be created with bubbles or other defined material structures inside the material, prepared during the single crystal growth phase with the EFG method, for example, or during the single crystal working. The single crystal phosphor can also function as the optics itself above one or several semi-conductor chips. For example FIG. 2, where there is no need for other silicone, epoxy or mirror optics to make light homogeneous. This is accomplished by having the phosphor side averted from the chip in the shape of the spherical cap so that the transformed light impinges on the phosphor and surrounding environment interface as near the perpendicular line as possible and increases the total extraction performance at the expense of the light, trapped in the phosphor due to the total reflection effect.

In comparison with the so far patented procedures, the material used as the single crystal phosphor is the material enabling the efficient use of the InGaN chips with the emission peak even below 460 nm which makes it possible to obtain a diode with up to 5% higher luminescent efficiency (lm/W) in comparison with the standard diodes and it covers too the visible light area below 450 nm. The phosphor is also used as the optics itself of the efficient white light emitting diode which simplifies the construction of the whole device. The single crystal phosphor with optimized external phosphor surface, averted from the chip, also delivers significantly higher external luminescent efficiency, higher ratio of the extracted light from the phosphor and of the light absorbed by the phosphor, in comparison with all the so far utilized solutions. There is too a significant decrease in the reverse light reflection causing the chip and phosphor warming-up which extends the real time of diode durability since there does not occur such intensive thermal degradation of the phosphor material itself, nor the degradation of the phosphor and silicone lens interface.

REFERENCE SIGNS LIST

10 White light emitting diode
11 Supporting pad

13 Chip
14 Cooler
15 Heat conducting paste
16 Cathode
17 Anode
18 Wire
19 Metal conducting layer
32 Single crystal phosphor
21.1 Plate
21.2 Spherical cap
22 Scattering centre
23.1 Emitting phosphor surface (averted from chip)
23.2 Non-active phosphor surface (towards chip)
24 Supplementary chip
31 Silicone polymer
32 Anti-reflex layer
33 Reflex layer
41 Light from chip
42 Luminescent centre
43.1 Light from phosphor (in desirable direction)
51 Monocrystalline ingot
52 Monocrystalline slab
54 Supporting foil

DETAILED DESCRIPTION OF THE
PREFERRED EMBODIMENTS

Figure 3:
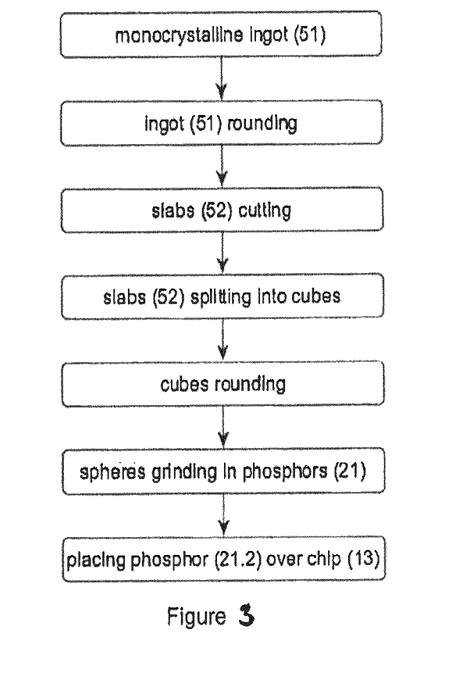
FIG. 3 Single crystal phosphor spherical caps production procedure

Example 1—Production of Half-Balls (FIG. 3)

The melt for the preparation of the monocrystalline ingot 51 for the production of the single crystal phosphor 21 was in the stoichiometric composition of the resulting monocrystalline ingot 51 $(Lu_{0.6}Y_{0.4})_3Al_5O_{12}$ with 1 wt % of cerium oxide $CeO_2$. Regarding the $CeO_2$ concentration in the melt and the developing monocrystalline ingot 51, the distribution coefficient is 10 to 1. The $Ce^{3+}$ dopant concentration is then only 10% of the current $Ce^{3+}$ concentration in the melt. This phenomenon manifests itself by the increasing $Ce^{3+}$ concentration towards the end of the monocrystalline ingot 51 where, in case of the classical Czochralski method, it can double in comparison to its beginning, and, equally, the concentration of microscopic and macroscopic defects increases towards the crystal end. To maintain the colour rendition of the resulting diode, the resulting shape or size of the single crystal phosphor would have to be adjusted. In case of the monocrystalline ingot 51 prepared by the method according to WO2012110009 the ingot was prepared in the (111) orientation with the weight of 4.7 kg from the melt with the initial weight of 18 kg, whereas in this case the $Ce^{3+}$ concentration variation was negligible in the monocrystalline ingot 51.

The monocrystalline ingot 51 was subsequently cut with a diamond disk saw into monocrystalline cubes 53 with 3 mm edges. Then they were gradually cut in grinding mills for precious stones working into a spherical shape with the diameter of 1.7 mm. The emitting surface 23.1 of the spherical caps 21.2 was worked during the production to obtain the roughness $R_a = 1$ μm. This achieves the homogeneous light extraction in all the directions. The 1.7 mm diameter balls were cemented en mass with wax onto a holder for working. Subsequently they were gradually cut off from one side until one half of the material was removed. The non-active surface 23.2 of the spherical caps 21.2 was polished with a diamond suspension. The holder with polished spherical caps 21.2 was transported into a steaming apparatus and the non-active surface 23.2 of the spherical caps 21.2 was subsequently provided with a reflex optic layer 33 consisting of 6 thin layers of $SiO_2$—$TiO_2$ with the total thickness of 4 micrometers. The individual spherical caps 21.2 were subsequently de-cemented in a thermal bath from the holder. The production procedure complied with the process in FIG. 3.

Figure 4:
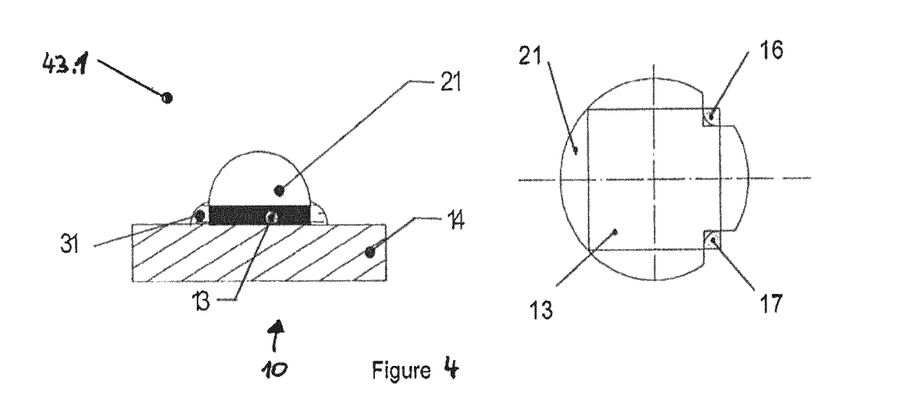
FIG. 4 Light emitting diode with a single crystal phosphor in the shape of spherical cap with contact openings FIG. 5 Single crystal phosphor plates production procedure FIG. 6 Single crystal phosphor plates with opening for chip contacting FIG. 7 Single crystal phosphor plates layout on supporting foil FIG. 8 Single crystal phosphor plates layout on supporting foil FIG. 9 Single crystal phosphor plates layout on supporting foil FIG. 10 Light emitting diode with a single crystal phosphor in the form of a plate FIG. 11 Single crystal phosphor with scattering centres in the form of holes FIG. 12 Light emitting diode with a single crystal phosphor with induced scattering centres in the form of holes FIG. 13 Light emitting diode with a separated and cooled single crystal phosphor and anti-reflex layer FIG. 14 Light emitting diode with more chips and a separated and cooled single crystal phosphor and anti-reflex layer FIG. 15 Light emitting diode with more chips and a separated single crystal phosphor in the form of spherical cap FIG. 16 Light emitting diode with a separated single crystal phosphor in the form of spherical cap FIG. 17 Light emitting diode with a combination of more phosphors in the form of spherical caps FIG. 18 Light emitting diode with a combination of more phosphors in the form of plates FIG. 19 Light emitting diode with a single crystal phosphor in the form of a plate over more chips FIG. 20 Light emitting diode with a single crystal phosphor and consisting of more layers

Example 2—Application of Half-Balls (FIG. 4)

The single crystal phosphor 21 of the $Gd_3(Al_{0.4}Ga_{0.6})_5O_{12}:Ce^{3+}$ composition, produced from the monocrystalline ingot 51 prepared with the Kyropoulos method, was mechanically worked using the crystal working technology in compliance with Example 1 into the spherical cap 21.2 shape with the diameter of 1.4 mm. The emitting surface 23.1 of the single crystal phosphor 21 in the spherical cap 21.2 shape was worked with the median roughness value of $Ra = 0.7$ μm. The single crystal phosphor 21 was fixed to the InGaN chip 13 with a transparent silicone polymer 31 with the refractive index minimally 1.5 to increase the optical outcoupling of light from the chip 13 towards the single crystal phosphor 21 and to cover the whole surface of the chip 13 (FIG. 4). Cut-outs were created with laser in the spherical cap 21.2 in the place of contacting the cathode 16 and anode 17 of the InGaN chip 13. The non-active surface of the phosphor 23.2 was polished and provided with a reflex layer 33 on the basis of $SiO_2$—$TiO_2$ for wavelengths exceeding 500 nm. The phosphor light 43.1 extracted from the single crystal phosphor 21 was evenly directionally restricted to the angle of 180° in the direction from the chip 13 itself. The whole above described assembly of the white light emitting diode 10 was located on an aluminium cooler 14. The white light emitting diode 10 with the single crystal phosphor 21 in the shape of the spherical cap 21.1 showed excellent colour homogeneity of the resulting light, independent of the light angle. The resulting diode gave the impression of white colour with the CRI value=80.5 and colour temperature CT=6 230 K.

Figure 5:
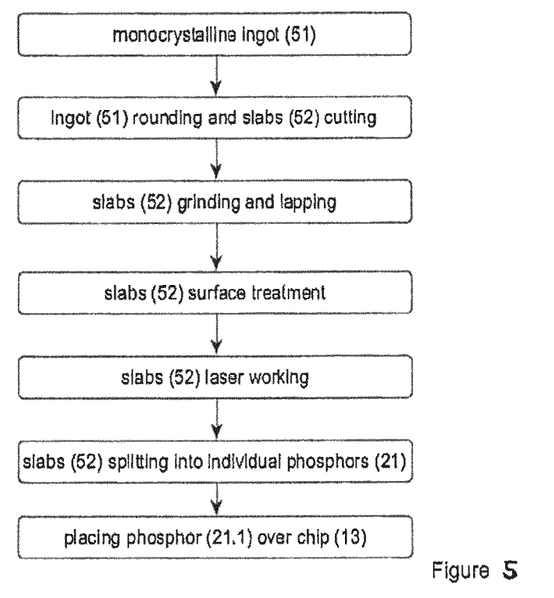

Example 3—Production of Plates (FIG. 5)

Monocrystalline ingots 51 were prepared according to the WO2012110009 method and in compliance with Example 1 with a $(Lu_{0.5}Y_{0.5})_3Al_5O_{12}$ host and 0.1 wt % $Ce^{3+}$ concentration doping. The used basic materials were $Al_2O_3$ and $Lu_2O_3$ and $Y_2O_3$ in the stoichiometric ratio and with purity of minimally 99.995%, the doping was inserted with the $CeO_2$ cerium oxide with the volume of 1 wt % and purity 99.999%. The prepared monocrystalline ingot 51 from the $Y_3Al_5O_{12}:Ce^{3+}$ material had its crystal beginning and end removed with a diamond disk saw. Subsequently, it was rounded around its circumference to obtain the uniform diameter of 110 nm. The rounded monocrystalline ingot 51 was fixed to the pad with epoxy and located within the space of the wire saw. It was cut with the diamond grain wire saw into slabs with the thickness of 0.15 mm. The individual slabs were subsequently boiled out in the $HNO_3$ and HCl acid mixture to remove the deposits of cement, cooling liquid and abrasive materials.

Figure 6:
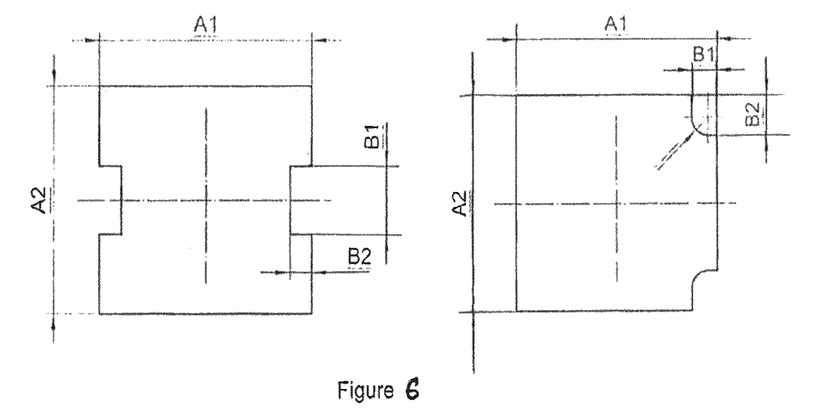
Figure 7:
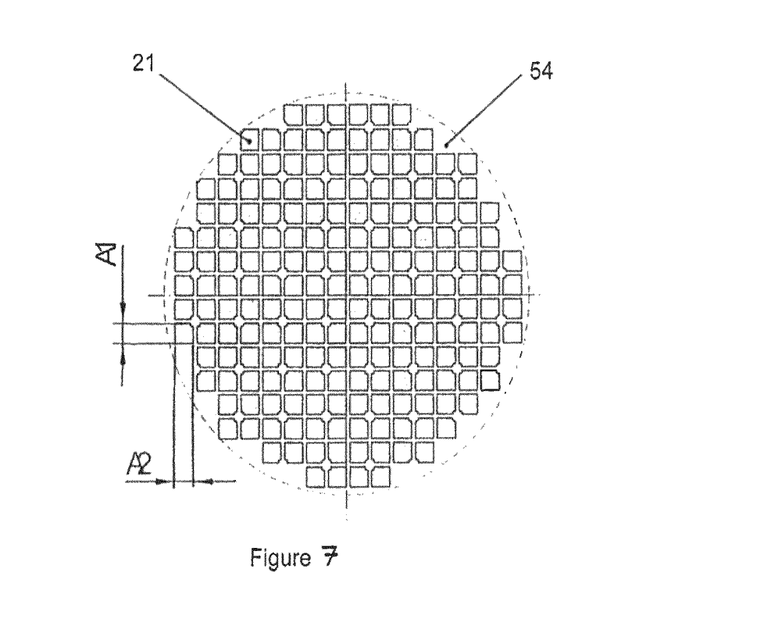
Figure 8:
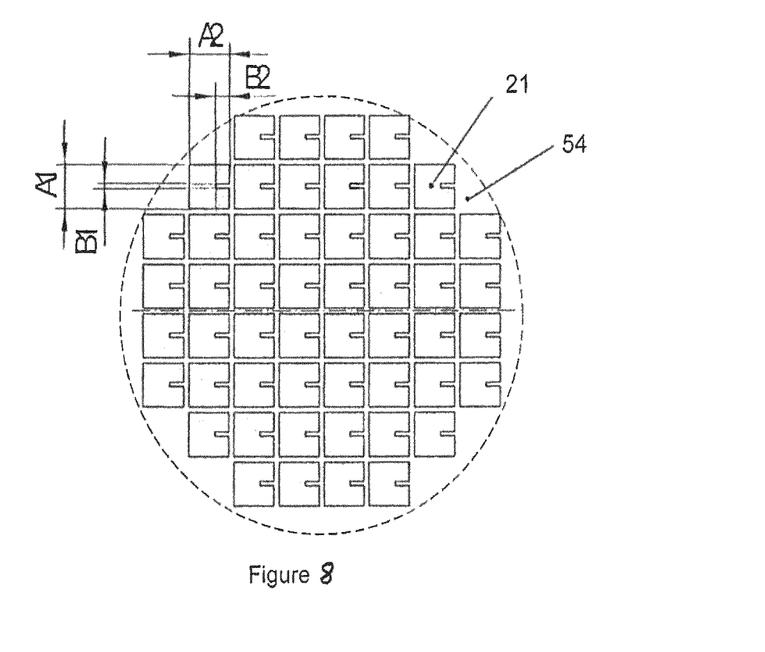
Figure 9:
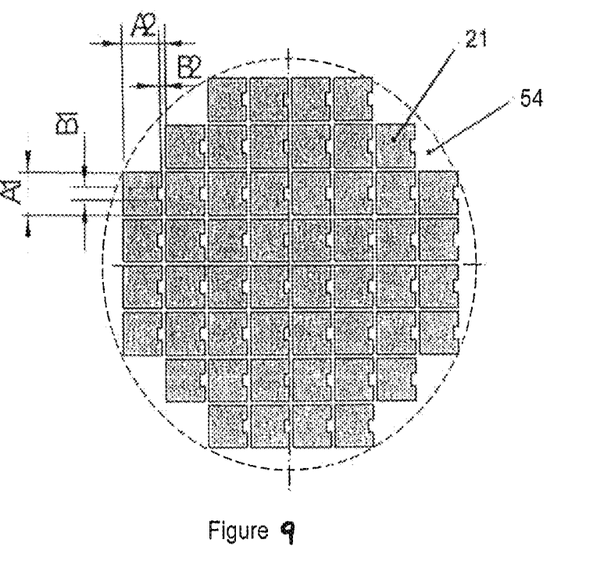
Figure 10:
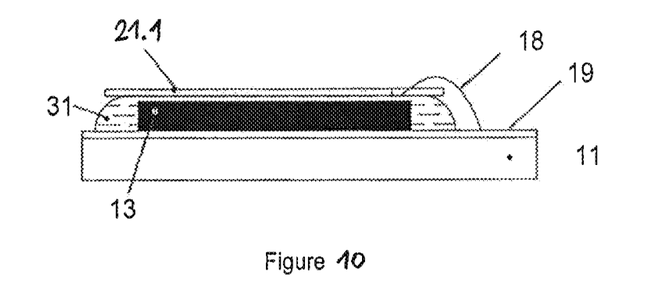

The monocrystalline slabs 52 were inspected and checked in crossed polarizers and under the UV discharge lamp to detect the presence of internal defects. The dopant content was checked by measuring the emission spectrums in randomly selected slabs. Holes with the dimension of B1=150 μm and B2=200 μm in compliance with FIG. 11 were drilled by pulse laser into the monocrystalline slabs 52 so that after locating the phosphor, the InGaN chip 13 itself could be contacted from above with the golden wire 18. The monocrystalline slab was subsequently placed onto the supporting foil 54 with UV-sensitive adhesive which was stretched in a frame, ensuring the positioning in the "pick-and-place" feeder of the automatic machine. Then the slabs 52 were cut with the Nd:YAG laser into plates with sides defined by the chip size (A1=1.1 mm and A2=1.1 mm) (FIG. 6). The dimensions of the holes and plates 21.1 can be varied, only the arrangement of the plates 21.1 on the supporting foil 54 depends on size of the chip 13 and the manner of its contacting. The arrangement was in accordance with FIG. 7 in case of the chips 13 contacted in the corner or in accordance with FIG. 8 or 9 in case of the chips 13 contacted in a different place of the chip 13. Arbitrary combination and number of these cut-outs, as well as the orientation of the individual plates 21.1, are technologically equivalent. The individual plates 21.1 remained rigidly fixed onto the supporting foil 54 until being illuminated with UV light which caused the degradation of the abrasive. The frame with the plates 21.2 was then placed into the holder with a vacuum or mechanical manipulator and the individual slabs 21.1 were subsequently placed with the "pick-and-place" handling automatic machine into the exactly defined position over the InGaN chip 13 so that the cut-outs in the monocrystalline plates 21.1 were in the positions of contacting the chip 13 with golden wires 18. The plates 21.1 were fixed to the chip 13 and monocrystalline supporting foil 11 with adhesive silicone polymer 31 (FIG. 10). The location of the plate 21.1 over the InGaN chip 13 and metal layer 19 on the supporting pad 11 was finalized by hardening the silicone polymer 31 at the defined temperature exceeding 70° C. The white light emitting diode 10 produced by the above described process showed excellent long-term stability of luminous flux, tested for the period of 500 hours and with the luminous flux of 60 lm which was also the value of a similar white light emitting diode with a powder phosphor, the drop in extraction was not observed in any of the cases.

Example 3.2—Production of Plates with the EFG Method

The monocrystalline slab 52 prepared with the EFG method with dimensions of 0.5×40×500 mm was prepared from the melt of the $Lu_2O_3$, $Y_2O_3$ and $Al_2O_3$ oxides in the stoichiometric ratio $(Lu_{0.2}Y_{0.8})_3Al_5O_{12}$ with the $CeO_2$ doping. The melt in a molybdenum crucible rose with the assistance of saturating agent towards the shaping die with the defined dimensions of 0.5×40 mm. There were grooves in regular distances at the edge and inside the die through which bubbles with the size of 10 to 50 μm were inserted evenly in the single crystal. Subsequently, the monocrystalline slab was cut with the Nd:YAG laser into individual single crystal phosphors 21 in the shape of plates 21.2 with the dimensions of 1×1×0.5 mm. The bubbles in the single crystal phosphor 21 function simultaneously as effective scattering centres that do not decrease the phosphor efficiency and increase the extraction of the light from the monocrystalline phosphor 21, otherwise restricted with the total reflection phenomenon at the interface of the single crystal and its surrounding.

Example 4—Monocrystalline Slabs Sandblasting

The monocrystalline ingot 51, prepared in accordance with Example 3, was cut with the diamond disk saw into monocrystalline slabs 52 with the thickness of 0.35 mm. The monocrystalline slabs 52 were consequently glued with wax to a metal pad and placed into a sand blasting chamber. The abrasive material on the basis of $B_4C$ with the grain size from 0.2 to 5 micrometers was expanded from a nozzle under the angle of 10° and under the pressure of 5 bar. The impacting grains created orientated scratches on the phosphor slab surface, with grooves with the width given by the grain size, depth of approximately ½ of their widths and lengths from units to hundreds of micrometers. After being de-cemented from the pad, each monocrystalline slab 52 was glued to the supporting foil 54 with an adhesive sensitive to UV light.

The monocrystalline slab 52 glued to the supporting foil 54 was subsequently cut with a diamond straight saw into plates 21.1 with the sides of 1.1×1.1 mm. The carrier with monocrystalline plates 21.1 was illuminated through the supporting foil 54 with ultraviolet light causing the degradation of the adhesive on the supporting foil 54 which thus enables the final handling of the individual phosphor plates 21.1.

Example 5—Slabs Etching

The emitting surface 23.1 of the single crystal phosphor 21 was chemically treated to attack the surface layer into the depth of units of micrometers. The entry point was the monocrystalline slab 52 with the diameter of 60 mm and thickness of 0.3 mm. The monocrystalline slab 52 was heated to the temperature of 110° C. and subsequently embedded into wax, spread in a thin layer on the teflon supporting foil 54. The other side of the slabs, that is the side with the phosphor 23.1 surface averted from the chip 13, was provided with a silicone template in the shape of parallel lines with the distance of 100 μm, prepared with screen process printing. The teflon supporting foil 54 was then placed into the concentrated hydrofluoric acid solution and heated to the temperature of 60° C. for the duration of 1 hour. In places which were in contact with the acid, there appeared in the monocrystalline slab 52 surface defects with the depth of up to 30 μm enabling higher outcoupling of the light from the material.

Example 6—Hydrogen Bromide Etching

Plasma surface etching with hydrogen bromide was applied through a selective mask in the sieve onto the surface of monocrystalline slabs 52, prepared in accordance with Example 3, which resulted in defects with the depth of up to 10 μm, defined by the mask shape. The acquired surface structures increased the extraction of light in the defined parts of the phosphor.

Figure 11:
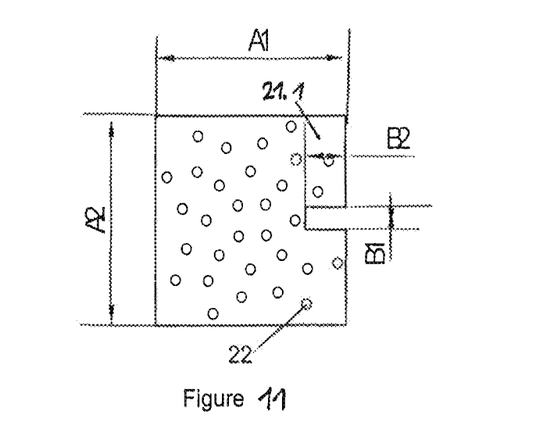
Figure 12:
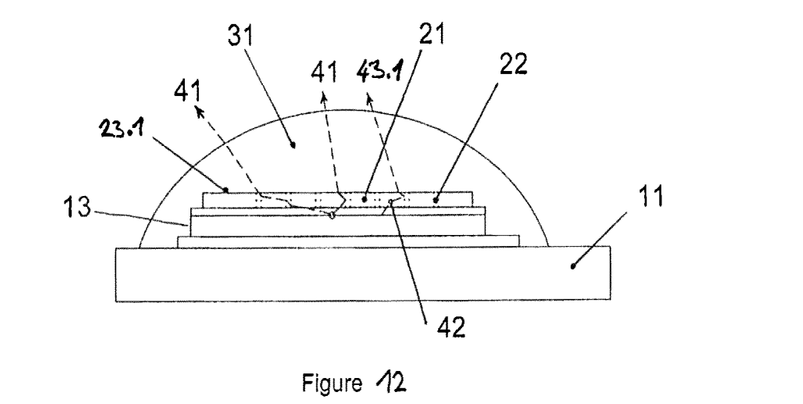

Example 7—Holes Drilling (FIGS. 11 and 12)

The plate of the single crystal phosphor 21 with the dimensions of 0.2×1.5×1.5 mm with the surface of the median roughness value Ra=0.45 μm was provided with defined openings with the diameter of 20 to 25 μm, prepared with laser beam drilling (FIG. 11). These openings then act as scattering centres 22 in the shape of holes. The monocrystalline slab 52 was inserted in the holder with linear drives under the laser head. The pulse Nd:YAG laser illuminated the monocrystalline slab 52, whilst the linear engines moved the monocrystalline slab 52 with the speed of 600 mm/min in the X axis. When the edge of the monocrystalline slab 52 was reached, the slab was always shifted in the Y axis by 70 μm and in the counter direction in the X axis. This process was repeated until the whole monocrystalline slab 52 was provided with defined holes with the diameter of 20 to 25 µm. The arrangement of scattering centres 22 in the form of holes is performed in the manner to maximize the probability of scattering of light during the passage through the phosphor. The plate 21.1 was placed over the InGaN chip 13 and the supporting pad 11 and fixed with the transparent silicone polymer 31. The light 41 coming out of the InGaN chip 13 was partially converted with the single crystal phosphor 21 during the absorption in the luminescent centre 42 and the light from the chip 41 passed partially through it. The light generated by the luminescent centre 42 in the single crystal phosphor 21 was evenly emitted in all sides. The lost light, which would be trapped in the single crystal phosphor due to the total reflection influence or would be emitted into sides, will be diverted at the scattering centres 22 and, with a higher probability, the light from the phosphor 43.1 will be extracted in the desirable direction from the emitting surface of the phosphor 23.1 (FIG. 12).

Figure 13:
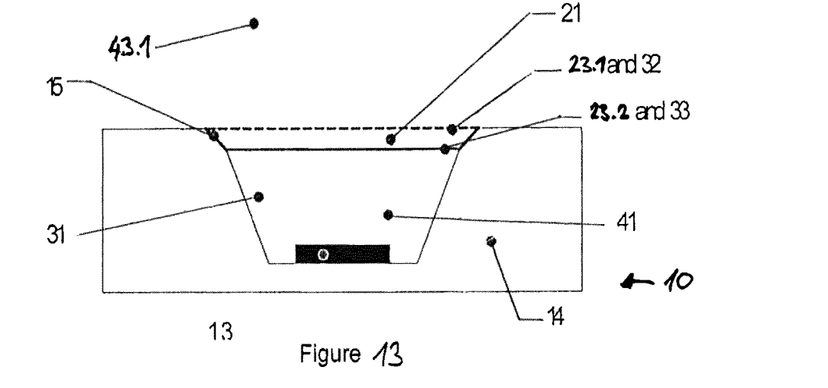
Figure 14:
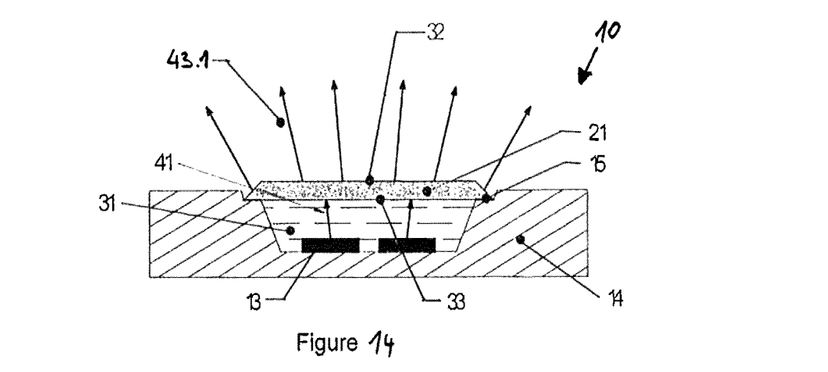

Example 8—Plate with Anti-Reflex Layer+Chamfering (FIGS. 13 and 14)

The monocrystalline slabs 52 with the thickness of 0.5 mm were treated with the mechanical working (Example 7) or chemical and mechanical working (Example 6) on the emitting surface of the phosphor 23.1 so that the increase in light extraction from the phosphor 43.1 from the single crystal phosphor 21 was achieved. Subsequently, this surface was polished with a polishing agent with loose diamond so that the scratch/dig surface quality (according to the MIL-O-13830A standard) reached the value of minimally 40/20. Then the anti-reflex layer 32 on the basis of $MgF_2$ was applied with steaming on the polished surface of the slabs 52 for the wavelengths from 500 to 700 nm, which resulted in the increase in the extraction of the yellow and red components of visible light. The other side of the monocrystalline slab 52 non-active phosphor surface 23.2 was worked with abrasive materials in such a manner that the median roughness value was $R_a$=0.2 µm and was provided with a reflex layer 33 for the wavelengths exceeding 500 nm. The plate 21.1 of the single crystal phosphor 21 was subsequently produced in such a manner that its edges were chamfered with facets in the angle of 45°. This was acquired by cutting the monocrystalline slab 52 with a diamond disk saw with the chamfering of 45°. In the application the plate 21.1 was placed into the cooler 14 (as the "remote phosphor") and connected with it thermally with a heat-conducting paste 15 over one (FIG. 13), or, possible, over more individually controlled chips 13 (FIG. 14). The facets served equally as scattering surfaces for lost light which would otherwise have spread into the sides. The space between the chip 13, cooler 14 and plate 21.1, through which the light from the chip 41 passed, was filled up with the transparent silicone polymer 31 with a refractive index of 1.5.

Figure 15:
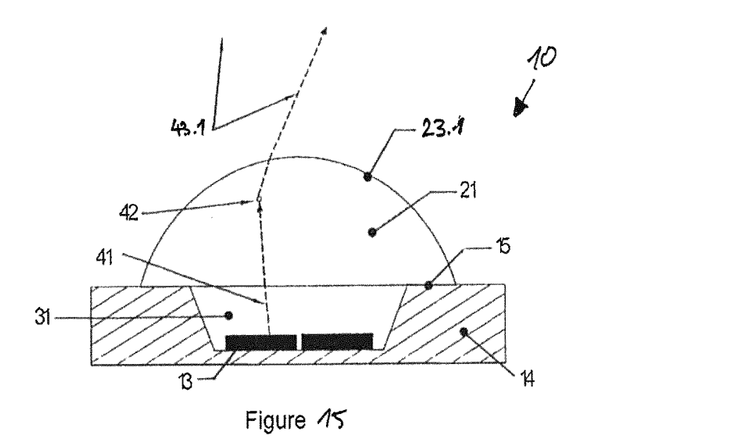

Example 9—Remote Half-Ball Over More Chips (FIG. 15)

The monocrystalline material of the phosphor 21 was worked into the spherical cap 21.2 with the radius of 5 mm, in accordance with Example 1. The single crystal phosphor 21 was subsequently fitted into the alumina cooler 14 over four InGaN chips 13 emitting blue light. During the passage through the single crystal phosphor 21 in the luminescent centres 42, the light from the chip 41 is converted with the Stokes shift. The emitting phosphor surface 23.1 was polished in the quality Ra<0.1 µm. The single crystal phosphor 21 was connected to the alumina cooler 14 with heat-conducting paste 15. The transparent silicone polymer 31 with the refractive index of minimally 1.5 was used as the light conducting layer between the spherical cap 21.2 and the individual chips 13. In this arrangement, more than 50% of the converted light from the phosphor 43.1 was emitted in the desirable direction by the emitting surface 23 in the direction away from the chip 13.

Figure 16:
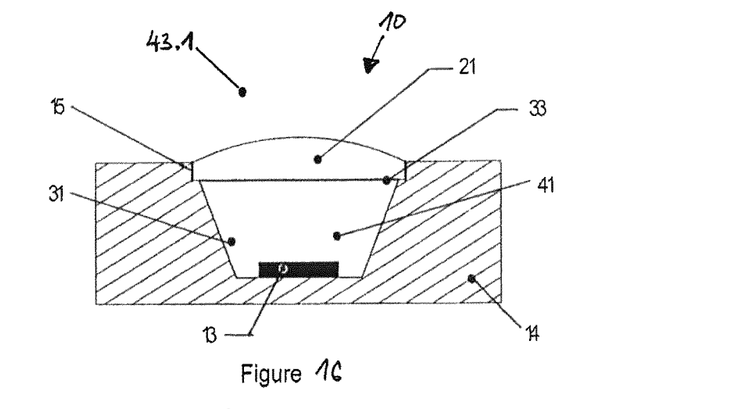

Example 10—Spherical Cap and Reflex Layer (FIG. 16)

The single crystal phosphor 21 in the shape of the spherical cap 21.2, prepared in accordance with Example 1, was placed over the chip 13 and separated ("remote phosphor") with silicone polymer 31 which served as a light-conducting layer for the light generated by the chip 41. The single crystal phosphor 21 was placed in such a position that it would be in physical contact with the cooler 14. To improve the transfer of the heat generated by the single crystal phosphor 21, it was connected with the thermal cooler 14 with the heat-conducting paste 15. In this manner it is possible to keep the real temperature of the single crystal phosphor 21 at the temperature of approximately 90° C. To increase the extraction of the light from the phosphor 43.1, the non-active surface of the phosphor 23.2 was provided with a reflex layer 33 on the basis of the $SiO_2$—$TiO_2$ layers, optimized for the wavelengths from 500 to 700 nm.

Example 11—Remote Phosphor Plate

The plate 21.2 of the single crystal phosphor 21 of a circular shape with the diameter of 2 mm and the thickness of 250 micrometers, produced from the monocrystalline slab 52 by cutting with the Nd:YAG laser, was placed in the alumina holder 14 over the InGaN chip 13. The holder functioned too as a thermal cooler 14 for the withdrawal of the heat, generated by the single crystal phosphor 21 during the conversion of the light. The single crystal phosphor 21 was connected with the thermal cooler 14 with the heat-conducting paste 15. The space between the single crystal phosphor 21 and the InGaN chip 13 was filled with the light-conducting layer of the optically transparent silicone polymer 31 with the refractive index of minimally 1.5.

Figure 17:
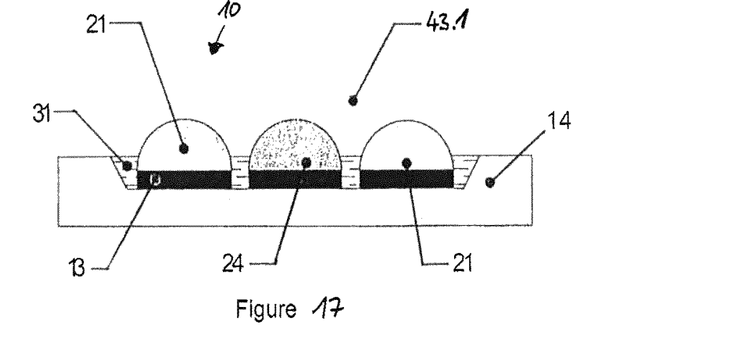
Figure 18:
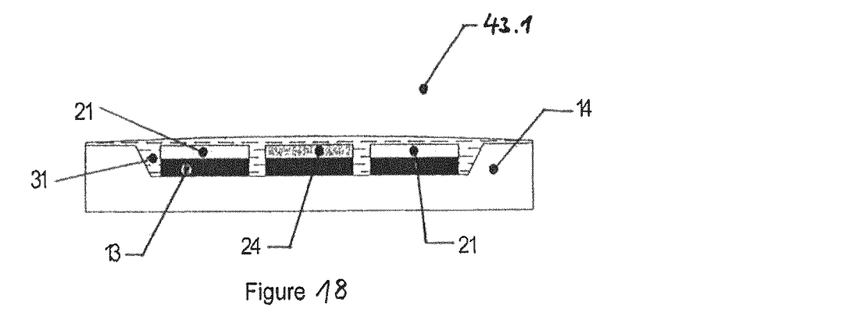

Example 12—More Phosphors and More Chips Combination (FIG. 17 and FIG. 18)

In the case of the diode with more InGaN chips 13, there were used several single crystal phosphors 21 (($Lu_{0.3}Y_{0.7}$)$_3$$Al_5O_{12}$:$Ce^{3+}$ with luminescence peak at 545 nm) and complementary phosphors 24 ($YAlO_3$:$Ti^{3+}$ with luminescence peak at 580 nm). The spherical caps 21.2 from the single crystal phosphor 21 and complementary phosphor 24 were placed directly onto the semi-conductor InGaN chip 13 (FIG. 17) with the emission peak at 450 nm. This resulted in acquiring the light containing the blue, yellow and red components of visible spectrum which brought a significant improvement in colour rendition. The individual single crystal phosphors 21 and complementary phosphors 24 were fixed in positions over the chips 13 on the cooler 14 with transparent silicone polymer 31. In this case, more than 50% of converted light from phosphors 43.1 is illuminated in the desirable direction. An equivalent solution may also include the combination of several InGaN chips with or only with AlGaN chips 13 emitting in the ultraviolet area or the chips emitting with the emission peak in the red area exceeding 600 nm. The equivalent solution includes too the replacement of spherical caps 23.2 with monocrystalline plates 23.1 (FIG. 18). The white light emitting diode 10 in the above described arrangement provided excellent colour homogeneity of light and the colour rendition index (CRI) value equal to 85.

Figure 19:
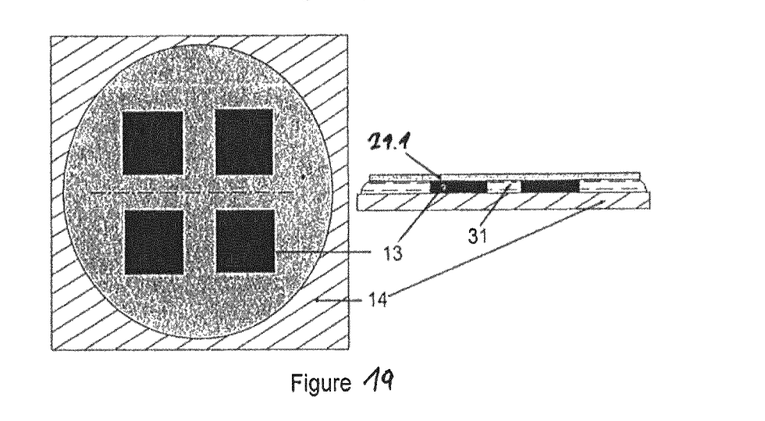

Example 13—Plate Over More Chips (FIG. 19)

The monocrystalline plate 21.2 of the single crystal phosphor 21 with the diameter of 5 mm and thickness of 250 μm was placed over four InGaN chips 13 so that it covered all these chips. The blue light from the chip 41 passed through the single crystal phosphor 21 and was partially converted to acquire the resulting white light with the temperature of 5500 K. The plate 21.2 was fixed to the InGaN chips 13 and to the alumina cooler 14 with optically transparent silicone polymer 31.

Figure 20:
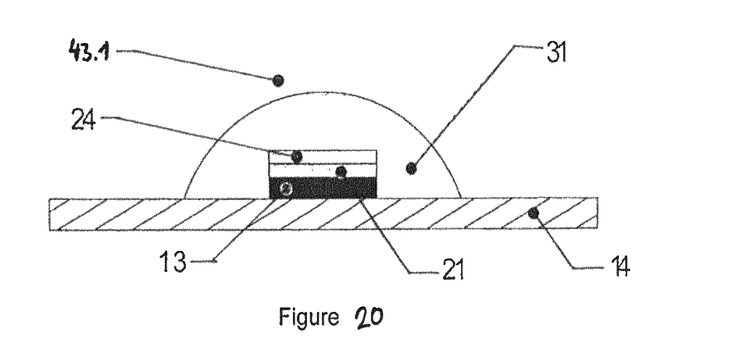

Example 14—Sandwich (FIG. 20)

The monocrystalline slabs 52 on the basis of $(Lu_{0.7}Y_{0.3})_3Al_5O_{12}:Ce^{3+}$ were used as pads for another function layer of $Al_2O_3:Cr$. This top layer of red complementary phosphor 24 was prepared with the method of the "LPE" liquid epitaxy. This layer functioned as an efficient layer for light outcoupling from the single crystal phosphor 21 and also contained a conversion phosphor with emission peak at 580 nm. The yellow single crystal phosphor 21 and the red complementary single crystal phosphor 21 were simultaneously separated in this manner to prevent the mutual undesirable dopant mixing which would lead to the increase in the total conversion material efficiency.

The same result was acquired also in the case when the second layer of the complementary phosphor 24 on the monocrystalline pad on the basis of $Y_3Al_5O_{12}$ was polycrystalline and prepared with the plasma spraying technology. The light from the chip 41 and the light from the phosphor 43.1 transferred without reflection directly into the material with a similar refractive index and due to a random grain orientation of this material it was outcoupled more easily from the phosphor. Silicon polymer 31, which functions too as the light homogenizing optics and a protective layer, was used to fix the combined single crystal phosphor 21 and the complementary phosphor 24 over the InGaN chip 13 and the alumina cooler 14.

Example 15—Sandwich—Red Phosphor in Silicone

The monocrystalline slab 52 on the basis of $(Lu_{0.7}Y_{0.3})_3Al_5O_{12}:Ce^{3+}$ with the diameter of 120 mm and thickness of 0.3 mm was provided from one side with a layer of $YAlO_3:Ti^{3+}$ from a crushed monocrystalline ingot 51 in an optically transparent silicone polymer 31 with the thickness of 0.2 mm. After hardening the top silicone layer, the slab was cut into the individual phosphors. To fix the combined single crystal phosphor 21 and the complementary phosphor 24 over the InGaN chip 13 and alumina cooler 14, the silicone polymer 31 was used which serves too as the light homogenizing optics and a protective layer.

Example 16—UV Phosphor with Induced Colour Centres

The single crystal phosphor 21 on the basis of the $(Lu_{0.1}Y_{0.9})_3Al_5O_{12}$ material with induced colour centres in the places of oxygen vacancies has an intensive absorption at 370 nm. When combined with the AlGaN chip, the single crystal phosphor 21 emitted light in the whole area of visible spectrum with two main peaks at 410 and 615 nm. The resulting light gave the impression of white colour with thermal temperature CT=3280 K and with the colour rendition index CRI value=90. In case of doping the material with cerium, the emitted light achieved the colour temperature CT=3750 K and the colour rendition index CRI value=94. When excited with the ultraviolet light with emission peak of 370 nm, the undoped material LuAG in the form of single crystal phosphor emitted orange light in the area from 500 to 700 nm with emission peak at 580 nm.

INDUSTRIAL APPLICABILITY

The efficient white light emitting diode (W-LED) with a single crystal phosphor can be utilized in all applications that require intensive lighting, such as the lighting of industrial halls, stadiums, street lightening, in headlights for transport vehicles, efficient personal flashlights or projectors.

The invention claimed is:

1. A white-light emitting diode with a single crystal phosphor placed over the chip selected from the InGaN, GaN or AlGaN group, wherein the single crystal phosphor is on the basis of hosts of LuYAG or YAP, doped with atoms selected from the $Ce^{3+}$, $Ti^{3+}$, $Eu^{2+}$, C, $Gd^{3+}$ or $Ga^{3+}$ group, and at the same time single crystal phosphor contains induced colour centres on oxygen vacancies with emission peaks at 410 nm and 615 nm.

2. The diode according to claim 1, wherein the single crystal phosphor on the basis of hosts corresponding to a chemical formula $(Lu_XY_{1-X})_3Al_5O_{12}$, where X is 0.01 up to 0.99, or $YAlO_3$, doped with $Ce^{3+}$, $Ti^{3+}$, $Eu^{2+}$, where $Lu^{3+}$, $Y^{3+}$ and $Al^{3+}$ atoms are replaced in the host with the $Gd^{3+}$ or $Ga^{3+}$ atoms in the amount of 0.01 to 99.9 wt %.

3. The diode according to claim 2, wherein the $Ce^{3+}$ concentration in the single crystal phosphor ranges from 0.02 up to 0.5 wt % and/or the $Eu^{2+}$ concentration ranges from 0.001 up to 1 wt % and/or the $Ti^{3+}$ concentration ranges from 0.05 up to 5 wt %.

4. The diode pursuant to claim 1 wherein the single crystal phosphor is provided with at least one more layer of the complementary phosphor on the aluminate basis from the $(Lu,Y)_3Al_5O_{12}$, $Y_3Al_5O_{12}$, $YAlO_3$ or $Al_2O_3$ group, doped with rare earths.

5. The diode pursuant to claim 4, wherein the single crystal phosphor is created with at least one layer of the complementary phosphor composed of $(Lu,Y)_3Al_5O_{12}:Ce^{3+}$ with the $Ce^{3+}$ concentration from 0.01 to 0.5 wt % and with at least one more layer of the complementary phosphor composed of $YAlO_3:Ti^{3+}$ with $Ti^{3+}$ concentration from 0.1 to 5 wt %.

* * * * *